United States Patent [19]

Huber et al.

[11] 4,080,576
[45] Mar. 21, 1978

[54] TOW MODE HARMONIC AND NONHARMONIC PHASE DETECTOR

[75] Inventors: W. Donald Huber, San Jose; Robert L. Cloke, Santa Clara, both of Calif.

[73] Assignee: Sperry Rand Corporation, New York, N.Y.

[21] Appl. No.: 788,183

[22] Filed: Apr. 18, 1977

Related U.S. Application Data

[63] Continuation of Ser. No. 647,594, Jan. 8, 1976, abandoned.

[51] Int. Cl.² .............................................. H03K 1/17
[52] U.S. Cl. ...................................... 328/155; 328/72; 328/110; 328/134
[58] Field of Search .............. 328/134, 155, 133, 120, 328/63, 72; 307/233 A, 232

[56] References Cited

U.S. PATENT DOCUMENTS

| | | |
|---|---|---|
| 3,470,475 | 9/1969 | Peterson et al. ................ 328/134 X |
| 3,514,698 | 5/1970 | Rey .................................. 328/134 X |
| 3,614,635 | 10/1971 | LaPine ................................ 328/155 |
| 3,755,748 | 8/1973 | Carlow et al. ..................... 328/155 |
| 3,870,900 | 3/1975 | Malaviya .............................. 307/232 |

Primary Examiner—John S. Heyman
Attorney, Agent, or Firm—Eugene T. Battjer

[57] ABSTRACT

A phase detector for use in data systems which recovers data from a recorded media, which phase detector operates in a nonharmonic mode during the period of synchronization of the clock frequency and phase with that of preamble data, and operates in a harmonic mode during actual data recovery.

9 Claims, 5 Drawing Figures

TOW MODE HARMONIC AND NONHARMONIC PHASE DETECTOR

This is a continuation, of application Ser. No. 647,594, filed Jan. 8, 1976 now abandoned.

BACKGROUND OF THE INVENTION

In data systems especially for use in computer systems, the data is recorded on a media in the form of ones and zeros, i.e., in digital form, which in magnetic recording are indicated on the media itself by the magnetic orientation of certain areas thereof. For using the data within a computer system, there must be synchronized therewith a clocking pulse which times the various functions of the system with the data. In very early day systems such clocking pulses were recorded directly on the media with the data being interspersed therebetween. However in present day systems, the clocking pulse is provided by an oscillator within the data recovery system which oscillator must be adjusted both in frequency and phase to match that of the data being read.

The adjustment of such oscillators is complicated in present systems by the fact that the oscillator must function at a harmonic frequency greater than the data frequencies because presently used codes allow for the nonrecording of pulses at predetermined locations to indicate data in the same manner as recorded pulses. The the clocking signal generator, however, must continue to function even though no data pulses are present for a predetermined period of time.

There is provided on the recording media, along with the recorded data, an initial series of pulses known as a preamble which is sensed for synchronizing the frequency and phase of a signal from the clock signal generator with that of the preamble. With the codes used today that include missing bits as a routine part of the code, it is necessary also that the clock signal generator be able to accommodate for missing bits. This dictates that the clock signal generator must be of a harmonic type for actual data recovery that is, it must operate at a frequency which is a harmonic or multiple of the data frequencies. However, in attempting to set or lock-in the clock during the preamble stage, it has been found that frequently such a harmonic clock will lock on an incorrect frequency. Naturally if the clock does this, difficulties arise when subsequently reading the data.

It is also necessary that the clock signal generator be capable of locking onto the preamble signal quickly so that a minimum space on the recording medium is used for the preamble. One solution used in the past has been to broaden the band width of the harmonic clocking pulse generator so as to increase the capability of the generator to lock rapidly onto the preamble signal. However the increase in band width increases the possibility the clock will lock onto an improper frequency. One solution to improper locking-in of the signal generator is to provide a clocking pulse generator of the nonharmonic type. Such a generator not only would adjust in phase to the preamble data, but also would only lock in on the exact frequency of that data. However as pointed out before, a harmonic type clock signal is required for data recovery when the data is recorded with certain bits deliberately omitted as in present day codes. Therefore, the usual answer has been to utilize a harmonic clocking signal generator with a narrow band width during the preamble locking-in phase to lessen the possibility of the generator locking onto improper frequency, but this requires a longer preamble.

It is the object of this invention to provide a clocking signal generator which takes advantage of the benefits of both harmonic and nonharmonic type generators by operating in two modes, that is, it operates in the nonharmonic mode during the locking-in period and in the harmonic mode during the readback operation.

SUMMARY OF THE INVENTION

A variable frequency clocking signal generator for use in data recovery systems including a variable frequency oscillator which varies its output frequency in response to an input error signal, a first means for generating an error signal in response to the frequency and phase relationship of the preamble data received and the oscillator output signal, an means for generating a second error signal in response to the frequency and phase relationship of the oscillator output signal and that of the data following the preamble means for supplying the error signals to the variable frequency oscillator, and switching means for supplying the error signal of the first means to the variable frequency oscillator during the reading of the preamble and the error signal of the second means to the variable frequency oscillator during the data recovery period.

DESCRIPTION OF THE INVENTION

Figure 1:
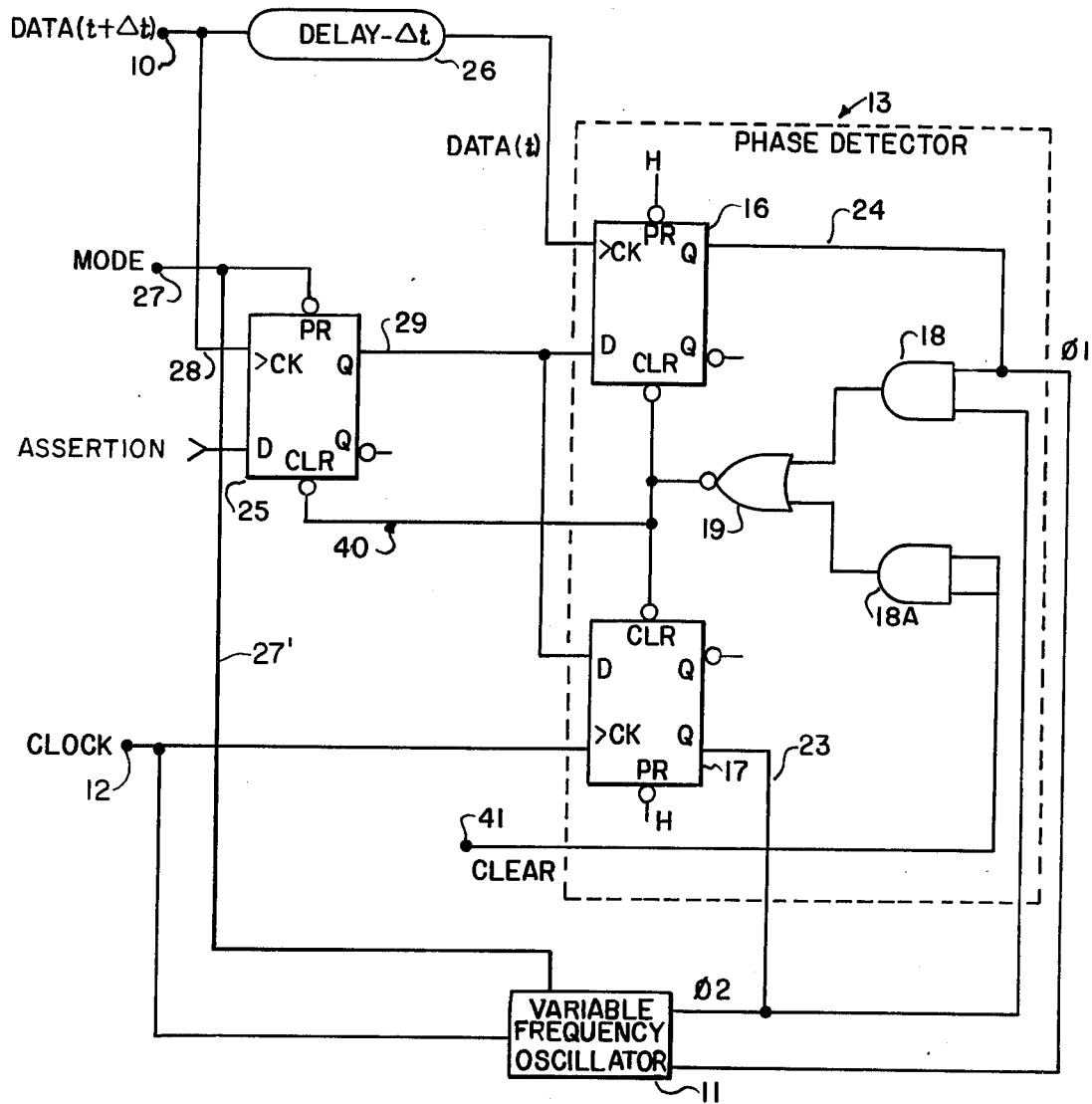
FIG. 1 is a block diagram of one embodiment of the invention.
Figure 2:
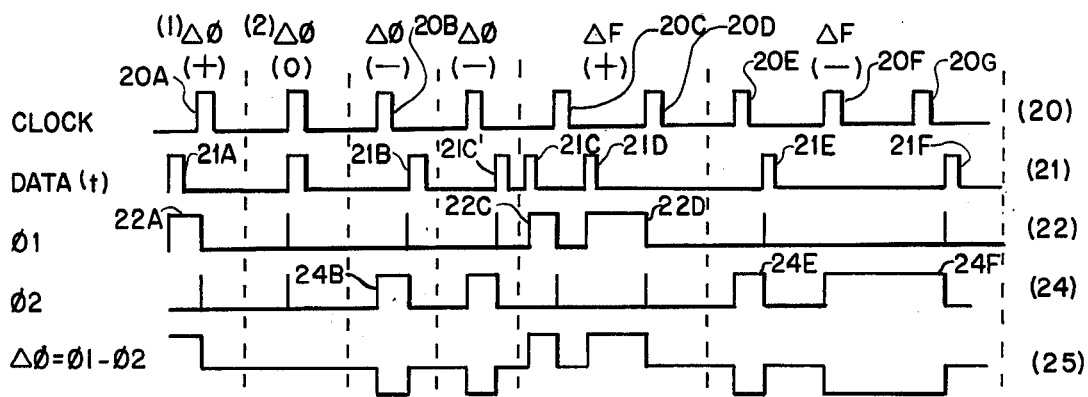
FIG. 2 shows various waveforms in the operation of the circuit of FIG. 1 in the nonharmonic mode.

The invention is embodied in the clock signal generator and frequency and phase detector shown in FIG. 1. In the block diagram, a data signal is received at the terminal 10 and utilized to set the phase and frequency of a variable frequency oscillator 11 (VFO) through the operation of a phase detector 13 to in turn supply an output signal to a terminal 12. The output signal can be similar to the clock waveform 20 shown in FIG. 2. This clock signal comprises a plurality of square wave pulses which must be synchronized in frequency and phase with the signal 21 of FIG. 2 representing the preamble data read back from the media (not shown). While the VFO operates in conventional manner at a harmonic of the preamble data signal, the clocking signal must be synchronized in frequency and phase with the data signal when fed into the computer system for proper processing of the actual data. As pointed out before, the data signal can comprise data bits interspersed with spaces where no bits are located, however the preamble data is recorded at a basic frequency to which the clocking signal must be synchronized.

Further, in the interest of minimizing the space occupied by the preamble on the recording media, the preamble is recorded in conventional manner at the minimum tolerable spacing corresponding to the highest frequency, that is, shortest period, of the actual data.

In accordance with the present invention, there is provided circuit means for permitting operation of the phase detector in both the harmonic and nonharmonic modes. The phase detector supplies to the variable frequency oscillator an error signal indicating when the frequency of the signal thereof should be increased or decreased, which error signal is generated as a result of a comparison of the data signal and the clock signal generated by the VFO. In the embodiment of the invention shown in FIG. 1 there is provided a first flip-flop circuit 16 and a second flip-flop circuit 17. These flip-flops serve as means for comparing the data and clocking signals to determine the phase relationship thereof. Such circuits are available in commercial form and are known by the industry standard number 7474.

The overall purpose of these flip-flops is to generate an error signal indicative of the phase relationship between the data and clocking signals. At the start of operation a clear signal may be applied to terminal 41 to feed through AND gate 18A and OR gate 19 to set lines 23 and 24 at a low signal level. For operation of the circuit shown in FIG. 1 in the nonharmonic mode a signal at the mode control terminal 27 is held low forcing the Q output 29 of flip-flop 25 high and acting by way of line 27' to cause the VFO output to be divided to equal the frequency of the preamble data. Thus, the D inputs of flip-flops 16 and 17 are held high and phase detector 13 is sensitive to frequency and phase errors as will now be described. The preamble data signal is supplied to the phase detector 13 and transmitted to the terminal CK of the flip-flop 16 and the clock signal is fed to the terminal CK of the flip-flop 17 of the same phase detector. Obviously if the flip-flop 16 receives a signal first, which means the data signal precedes the clocking signal, there must be fed to the VFO a phase error signal indicating that the frequency of the VFO and the clock signal derived therefrom should be increased to eliminate the phase error between the signals. Also if the clocking signal appears first, the phase error signal should indicate that the VFO should be slowed in frequency until the phase relationship is equal. The VFO functions to vary the frequency of the output signal generated in accordance with the magnitude of the error signal received.

For this purpose, the flip-flop 16 supplies at the terminal Q a signal $\phi 1$ to increase the frequency of the VFO while there is supplied at the flip-flop 17 terminal Q a signal $\phi 2$ indicating the VFO frequency should be decreased. At the same time, the signals $\phi 1$ and $\phi 2$ are fed to an AND gate 18 which acts through an OR gate 19 to supply a reset signal to the clear terminals CLR of the flip-flops 16 and 17. This signal resets the flip-flops to zero in preparation for receiving the next data and clocking signals.

Thus as just described, the phase detector 13 is operated in a nonharmonic mode wherein a phase error signal is generated for each clocking and data signal. This operation is shown in diagram form in FIG. 2 wherein are shown the clocking signals 20 and the data signals 21. In the first sequence (1) the data signal appears first as the pulse 21A followed subsequently by the clocking pulse 20A. With the initiation of the pulse 21A, there appears the phase error signal $\phi 1$ which continues until the initiation of the clocking pulse. The phase error signal $\phi 1$ appears as the pulse 22A. This signal is supplied to the VFO through the conductor 24 for resetting the VFO to increase the frequency thereof and make the phase relationship equal to that of the data pulse. In the second sequence (2), the clock and data pulses appear simultaneously as desired. Thus both $\phi 1$ and $\phi 2$ go high at the same time with the result that the flip-flops are instantaneously cleared and no differential phase error signal appears for transmittal to the VFO. The amount of delay added in clearing the two flip-flops 16 and 17 may be adjusted to compensate for delay and rise time in the following circuits to eliminate dead zone in the overall effective error characteristic.

In the subsequent set of pulses, the clocking pulse 20B appears prior to the data pulse 21B. Thus the terminal Q of the flip-flop 17 goes high first, resulting in a pulse 24B being transmitted through the conductor 23. The pulse 24B initiates with the forward edge of the clock pulse and terminates at the forward edge of the data pulse, thereby giving a time indication of the phase error.

Figure 3:
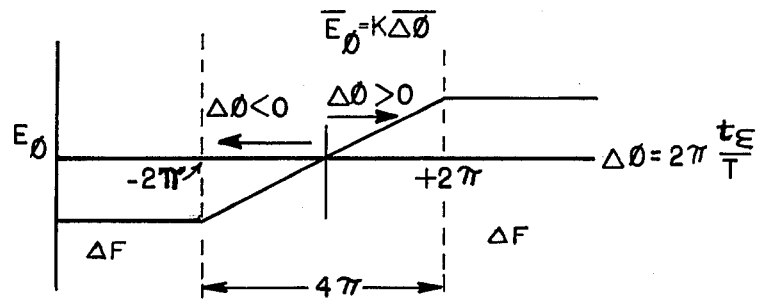
FIG. 3 shows the manner in which the phase error signal varies with the magnitude of the difference in phase between the data and the clocking pulse when the circuit of FIG. 1 is operated in the nonharmonic mode.

As shown in FIG. 3, the average value of the differential phase error signal $\Delta\phi$ is a direct result of the time differential between the occurrence of the two pulses. Herein is shown a graph of the linear value of the average error signal $\overline{E}_{100}$ versus phase difference, $\Delta\phi$, which is equal to $2\pi te/T$, where te is time difference and T is period of the clock and data signals. If the data and clock pulses are not coincident or do not alternate in occurrence, as indicated by data pulses 21C and 21C' occurring between two clock pulses, an error signal will be generated to provide both frequency and phase correction. If the data pulses are occurring at a higher frequency than the clock pulses, then the error signal $\phi 1$ is set high for a greater amount of time than the signal $\phi 2$. This fact is illustrated in FIG. 2 in the time sequence involving the clock pulses 20C and 20D and the data pulses 21C and 21D. In each instance where the data pulse occurs first in time, there is initiated a signal $\phi 1$ shown as the pulses 22C and 22D which serves to increase the frequency of the VFO to bring the clocking signal to a higher frequency. Similarly where the clocking pulses 20E, 20F and 20G appear at greater frequency than the data pulses 21E and 21F, there will be generated a signal $\phi 2$ shown as the pulses 24E and 24F to decrease the frequency of the signal generated by the VFO.

Thus as shown in FIG. 3, so long as the time difference between the clock and data signals is less $\pm$ T corresponding to a phase difference of than plus or minus $2\pi$ radians, the average value of the error signal is a linear function of the time difference between the flip-flop output signals. However for a phase difference greater than $\pm 2\pi$ radians, the error signal is a constant amount until such time as the phase relationship is brought within those limits. Thus there has been described a nonharmonic operating phase detector capable of generating a phase error signal between clocking and data pulses of equal or near equal frequencies. It will be understood of course that the VFO is oscillating during nonharmonic operation at a frequency which is a multiple of the data frequencies that will occur during actual data recovery, but the VFO output is divided down to provide clock pulses at a rate corresponding to that of the preamble data. In this way it is assured that the VFO will lock-on at the proper frequency in readiness for actual data recovery and the lock-on is made fast by virtue of the large linear phase range, namely $\pm 2\pi$ as illustrated in FIG. 3. It will be noted hereinafter in connection with the description of the harmonic mode of operation and particularly with reference to FIG. 5 that in such mode the clock frequency is higher and thus reduces the linear phase range to $\pm\pi$.

Thus in accordance with the present invention, the phase detector can be caused to operate in the nonharmonic mode just described, such as would be needed for locking onto the preamble signal of the recorded data. However as discussed previously, it is further beneficial for such a phase detector to operate in the harmonic mode and for this purpose, there is provided a third flip-flop 25 receiving as an input the data signal from the terminal 10 at the terminal CK. This same data signal is fed through a delay line 26 to the pair of flip-flops 16 and 17 in the manner described previously. While a delay line is used in this example, other types of delay devices can also be used, with as single shot circuits, etc. The purpose for the flip-flop 25 is to permit the phase detector to operate in a nonharmonic mode as described previously but also to permit operation in the harmonic mode to be described hereinafter. The flip-flop 25 can be of the same commercial type as the previous flipflops described.

For operation in the harmonic mode, the mode input signal supplied to the terminal 27 is set high so the signal on line 29 is not constantly at a high level and the clock frequency corresponds to the VFO frequency or some submultiple thereof suitable for recovering the actual data following the preamble. With the occurrence of a data signal at the terminal 10, such signal is transmitted through the conductor 28 to the terminal CK of the flip-flop 25. This sets the Q terminal of this flip-flop high permitting operation of the flip-flops 16 and 17 in the standard manner as previously described by supplying a suitable signal through the conductor 29 to the terminals D of both flip-flops.

The function of the flip-flop and the delay line 26 in this circuit is to permit operation of the phase detector in the harmonic mode by suppressing the generation of the phase error signal in the absence of a data signal. For this purpose, when the data signal is supplied for triggering the flip-flop 25 to permit operation of the flip-flops 16 and 17 to generate a phase error signal, the same data signal is supplied through the delay line 26 to the flip-flop 16. Thus the phase detector operates in the manner previously described. However in the absence of receiving any data signal, the Q output line 29 flip-flop 25 reamins low, thereby holding the level of the terminals D of the flip-flops 16 and 17 low, preventing the generation of a phase error signal.

In the manner described the anticipator comprising flip flop 25 and delay line 26 suppresses the generation of any error signal in the absence of a data signal and therefore permits the phase detector to operate in a harmonic mode. The delay line 26 can be caused to function with any normal delay time and in the example shown causes a delay delta t ($\Delta t$). When $\Delta t$ equals T'/2 where T' equals the clock period. Conditions are optimum in that the delay period centers the zero point of the output error signal.

Figure 4:
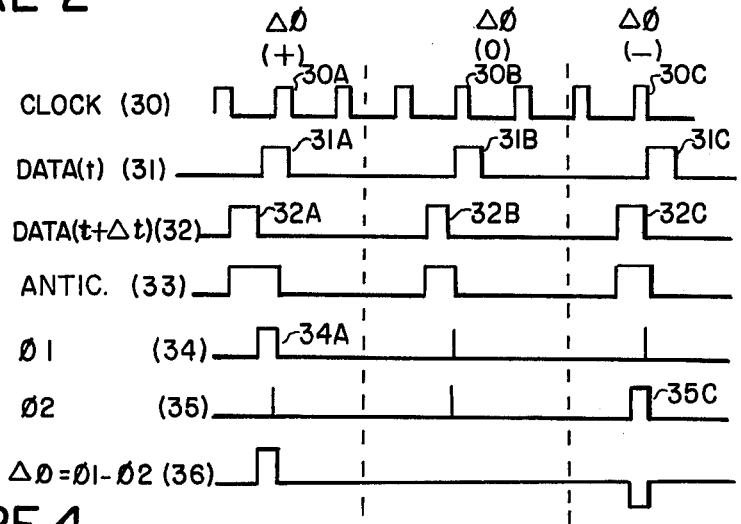
FIG. 4 shows various waveforms in the operation of the circuit of FIG. 1 in the harmonic mode.

Thus in FIG. 4 are shown waveforms of the phase detector for the harmonic mode of operation. As previously mentioned the clocking signal 30 thereof is of a higher frequency of harmonic of the data signal 31. In this example, it is the third harmonic frequency. For purposes of illustration, the data actually arrives at the time $t$ plus $\Delta t$ wherein the delay line 26 reduces the time to the time $t$. Thus as shown in FIG. 4, in each instance wherein a data signal at time $t$ plus $\Delta t$ appears at the terminal 10, there will be generated a data signal at time $t$ at the output delay line 26 and subsequently a phase error signal at the output phase detector 13. As shown, when the data signal at time $t$ appears first as illustrated by the pulse 31A which follows the pulse 32A by the interval $\Delta t$, there is initiated on the front edge of the pulse 31A a signal $\phi 1$ indicated by the pulse 34A. With the initiation of the clocking pulse the signal $\phi 2$ appears to clear the flip-flops 25, 16 and 17 and terminate the error signal $\phi 1$ by supplying a signal through the AND gate 18 and the OR gate 19 to the conductor 40.

With the occurrence of the subsequent two clocking signals, no data signal appears to set the flip-flop 25 thereby suppressing the generation of any error signal because of a failure of the flip-flop 25 to put a high level signal on the D inputs to enable the flip-flops 16 an 17 for operation. Subsequently there appears the data signal at time $t$ plus $\Delta t$ illustrated by the pulse 32B followed by the data signal 31B which coincides with the clocking signal 30B. Thus signals $\phi 1$ and $\phi 2$ go high at the same time and no error signal is generated. In the same manner when the clocking signal precedes the data signal as shown with the pulses 30C and 31C, there is generated a pulse $\phi 2$ indicated by the pulse 35C for slowing the frequency of the VFO. The anticipator pulses 33 represent the signal level on line 29 which is observed to go high at the occurrence of each data pulse at time $t$ plus $\Delta t$ and go low at the occurrence of the associated clock pulse or data pulse at time $t$ depending on which occurs last.

Thus as shown, if the data signal is earlier than the clocking signal, the error signal $\Delta\phi$ is positive and if the data signal is later than the clocking signal, the error signal $\Delta\phi$ is negative. If the signals are coincident or if there is no data pulse, the error signal is zero. Thus the average value of the error signal is a linear function of the timing difference between the error signals as shown by the differential signal 36 in FIG. 4.

Figure 5:
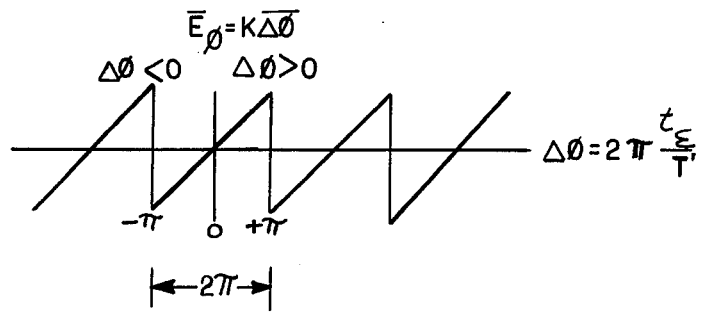
FIG. 5 shows the manner in which the phase error signal varies with the magnitude of the difference in phase between the data and the clocking pulse when the circuit of FIG. 1 is operated in the harmonic mode.

In FIG. 5 the average value of the error signal, $\overline{E}_{100} = \overline{\Delta\phi}$, is plotted vs $\Delta\phi$. The clock period is T' and time error is $t_\epsilon$. The error characteristic repeats for $t_\epsilon = kT' + \epsilon$ where $k$ is any integer including zero. The delay $\Delta t$, is set equal to T'/2 so as to cause the zero output to be in the center of the $\pm\pi$ linear dynamic range. Note that the linear dynamic range of the phase error characteristic in the harmonic mode shown in FIG. 5 is $\pm\pi$ radians which is one-half that of $\pm 2\pi$ radians for the nonharmonic mode of FIG. 3. Note further, as will be apparent to those skilled in the art, that the phase range $\pm\pi$ relates to the period of the clock signal in the harmonic mode while the phase range $\pm 2\pi$ relates to the preamble data period which corresponds to the clock signal of increased period used in the nonharmonic mode.

From the foregoing, it is apparent that by switching the modes of the circuit shown in FIG. 1 by the supplying of a low signal at the terminal 27, the phase detector can be caused to operate on all data signals received for the generation of an error signal, i.e. to operate in a nonharmonic mode, in which the clocking signal is synchronized in frequency with the data signal. Conversely, by supplying a high signal at terminal 27 the phase detector can be caused to operate only when a data signal is received, i.e., operate in the harmonic mode wherein the data signal may have missing pulses and the frequency of the clocking signal is an integer multiple or harmonic of the data signal frequencies. By supplying a low signal at the terminal 27 to cause the Q output 29 of flip-flop 25 to remain high and enable the flip-flops 16 and 17 for operation, the nonharmonic mode of operation is set for the phase detector. Such operation is achieved when the data being read is the preamble or a signal known to be equal in frequency to the clocking signal derived from the VFO for use in the nonharmonic mode. In this manner the VFO is always caused to lock in on the exact frequency desired for the data signal recorded following the preamble.

Following the nonharmonic operating mode, a high level signal may be supplied to the terminal 27 to switch to harmonic mode and allow operation of the flip-flop 25 in response to the receipt of a data signal from the terminal 10 through the conductor 28. In this mode the phase detector is permitted to operate only on the occurrence of a data signal. Thus the clocking signal can be a harmonic of the data signal and an error signal will still be generated to correct the phase relationships of the data and clocking signals.

In the manner described the VFO is permitted to operate only in the nonharmonic mode during the preamble and thereby caused to lock-in directly at a multiple of the frequency of the data received during this preamble stage. In this manner the phase detector cannot cause a false locking. Following this operation, the phase detector can be caused to operate in the harmonic mode such as is necessary for the detection of certain recorded data. However because the frequency of the VFO has previously been set to the desired harmonic of the data, there is no danger that the phase detector will now cause such a phase shift as to lock onto an incorrect frequency during actual data recovery.

The invention claimed:

1. A phase locked oscillator circuit for providing a pulse stream clock signal in response to an input pulse stream data signal having a series of pulses each occurring in a designated interval, comprising:

input means for receiving the data signal, variable frequency oscillator means for providing the clock signal which is varied in frequency in response to an error signal applied to said oscillator means, phase detector means coupled to said input means and said variable frequency oscillator means for detecting the time difference between each data pulse and an associated clock pulse to produce the error signal applied to said oscillator means, and said input means including switching means which can be switched to a first state for operation in a nonharmonic mode wherein the data pulses occur at substantially uniform intervals and the error signal is produced by comparing the time occurrence of each clock pulse with an associated data pulse, and switched to a second state for operation in a harmonic mode wherein the clock signal frequency is an integer multiple of data signal frequencies and the error signal is produced by comparing the time occurrence of data pulses and clock pulses only when a data pulse is present.

2. The phase locked oscillator circuit of claim 1 including mode control means operable in the nonharmonic mode for disabling said switching means so that said switching means is nonresponsive to the data signal and provides a signal constantly enabling said phase detector means whereby said phase detector means is responsive to each clock pulse for detecting the occurrence thereof relative to a data pulse occurring in a corresponding interval, and operable in the harmonic mode for enabling said switching means to be responsive to each data pulse for switching from a first state to a second state to enable said phase detector means only when a data pulse is received whereby said phase detector is responsive to each data pulse for detecting the occurrence thereof relative to an associated clock pulse.

3. The phase locked oscillator of claim 2 wherein said phase detector means includes gating means responsive to the output signal of said phase detector means for switching said switching means from the second state back to the first state when operating in the harmonic mode.

4. The phase locked circuit of claim 3 wherein said input means further includes delay means coupled to receive the data signal for delaying transmission thereof to said phase detector means a predetermined amount so that in the harmonic mode said phase detector means is enabled prior to application of a data pulse thereto.

5. The phase locked circuit of claim 4 wherein said delay means functions to delay the data signal a time increment substantially equal to one-half the clock signal period.

6. The phase locked oscillator of claim 2 wherein said phase detector means comprises first and second switchable means coupled to said switching means of said input means to be constantly enabled thereby in the nonharmonic mode and enabled in the harmonic mode only upon the occurrence of a data pulse applied to said input means, said first switchable means also being coupled to receive the data signal from said delay means for switching from a first state to a second state to provide a pulse output signal in response to a data pulse, and said second switchable means also being coupled to receive the clock signal from said variable frequency oscillator means for switching from a first state to a second state to provide a pulse output signal in response to a clock pulse.

7. The phase locked oscillator of claim 6 wherein said phase detector means further comprises gating means responsive to the simultaneous occurrence of pulse output signals from said first and second switchable means for providing a pulse which switches said first and second switchable means from the second state back to the first state in both the nonharmonic and harmonic modes and also switches said switching means of said input means from the second state back to the first state in the harmonic mode.

8. The phase locked oscillator of claim 7 wherein said input means further including delay means coupled to receive the data signal for delaying transmission thereof to said phase detector means a predetermined amount so that in the harmonic mode said phase detector means is enabled prior to application of a data pulse thereto.

9. The phase locked oscillator of claim 8 wherein said delay means functions to delay the data signal a time increment substantially equal to one-half of the clock signal period.

* * * * *